United States Patent
Zhang et al.

(10) Patent No.: US 9,775,224 B2
(45) Date of Patent: Sep. 26, 2017

(54) DISCHARGE APPARATUS AND DISPLAY PANEL PREPARATION SYSTEM BASED THEREON

(71) Applicants: Boe Technology Group Co., Ltd., Beijing (CN); Beijing Boe Display Technology Co., Ltd., Beijing (CN)

(72) Inventors: Zhichao Zhang, Beijing (CN); Zongjie Guo, Beijing (CN); Zheng Liu, Beijing (CN); Xiangqian Ding, Beijing (CN); Mingxuan Liu, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 306 days.

(21) Appl. No.: 14/500,379

(22) Filed: Sep. 29, 2014

(65) Prior Publication Data

US 2015/0359078 A1    Dec. 10, 2015

(30) Foreign Application Priority Data

Jun. 10, 2014    (CN) .......................... 2014 1 0256278

(51) Int. Cl.
  *H05F 3/04*    (2006.01)
  *H05K 9/00*    (2006.01)

(52) U.S. Cl.
  CPC ............. *H05F 3/04* (2013.01); *H05K 9/0067* (2013.01)

(58) Field of Classification Search
  CPC .. H05F 3/00; H05F 3/04; H02H 9/046; H01L 27/0248; G02F 1/1333; G09G 3/006; H05K 9/0067
  See application file for complete search history.

(56) References Cited

U.S. PATENT DOCUMENTS

| 5,029,041 A * | 7/1991 | Robinson | H01T 4/08 361/212 |
| 6,043,971 A * | 3/2000 | Song | G02F 1/136204 349/40 |
| 6,613,650 B1 * | 9/2003 | Holmberg | G02F 1/1309 257/E21.702 |
| 7,772,764 B2 * | 8/2010 | Goh | H01L 51/5203 313/505 |

(Continued)

FOREIGN PATENT DOCUMENTS

| CN | 101874298 | 10/2010 |
| CN | 203007417 | 6/2013 |
| JP | H04-213854 | 8/1992 |

OTHER PUBLICATIONS

Office action from Chinese Application No. 201410256278.5 dated Apr. 1, 2016.

*Primary Examiner* — Stephen W Jackson
*Assistant Examiner* — Christopher Clark
(74) *Attorney, Agent, or Firm* — Calfee, Halter & Griswold LLP

(57) ABSTRACT

A discharge device and a display panel preparation system based thereon are disclosed. The discharge device includes a conductive contact terminal electrically connected with an electrostatic discharge contactor of a substrate to be processed; and a voltage controller electrically connected to the contact terminal for adjusting a voltage on the contact terminal. The discharge device is able to eliminate (e.g., neutralize) the static electricity on the substrate to be processed.

15 Claims, 3 Drawing Sheets

(56) References Cited

U.S. PATENT DOCUMENTS

| | | | | |
|---|---|---|---|---|
| 8,208,084 B2* | 6/2012 | Lin | G02F 1/1345 | 349/192 |
| 2001/0054998 A1* | 12/2001 | Yeo | G02F 1/1345 | 345/87 |
| 2004/0109100 A1* | 6/2004 | Park | G02F 1/13454 | 349/40 |
| 2006/0103772 A1* | 5/2006 | Lee | H01L 27/0248 | 349/40 |
| 2007/0090410 A1* | 4/2007 | Chen | H01L 27/0251 | 257/223 |
| 2007/0188970 A1* | 8/2007 | Inaba | B65G 49/061 | 361/212 |
| 2007/0273802 A1* | 11/2007 | Nakamura | G02F 1/136204 | 349/40 |
| 2009/0091673 A1* | 4/2009 | Chen | G02F 1/1345 | 349/40 |
| 2009/0108270 A1* | 4/2009 | Chen | H01L 27/0248 | 257/88 |
| 2009/0294771 A1* | 12/2009 | Kim | G02F 1/136204 | 257/59 |
| 2009/0296011 A1* | 12/2009 | Yoon | G02F 1/1362 | 349/40 |
| 2011/0170043 A1* | 7/2011 | Lim | G02F 1/13452 | 349/116 |
| 2011/0279750 A1* | 11/2011 | Jeong | G02F 1/133615 | 349/61 |
| 2012/0273789 A1* | 11/2012 | Hui | G02F 1/136227 | 257/59 |
| 2014/0063677 A1* | 3/2014 | Chen | H01L 27/1214 | 361/212 |
| 2015/0187801 A1* | 7/2015 | Xu | H01L 22/32 | 257/48 |
| 2015/0255409 A1* | 9/2015 | Lee | H01L 23/60 | 257/59 |

* cited by examiner

DISCHARGE APPARATUS AND DISPLAY PANEL PREPARATION SYSTEM BASED THEREON

RELATED APPLICATIONS

The present application claims the benefit of Chinese Patent Application No. 201410256278.5, filed Jun. 10, 2014, the entire disclosure of which is incorporated herein by reference.

FIELD

This disclosure relates to display technologies, and particularly to a discharge apparatus and a display panel preparation system based thereon.

BACKGROUND

At present, during the manufacturing process of a TFT-LCD (Thin Film Transistor-Liquid Crystal Display) display panel, there may be a problem of abnormal discharge. Currently, a method of solving the abnormal discharge problem includes altering the photomask design for forming patterned layers, or altering the manufacturing process, and so on.

Altering the photomask design requires redesign of all the photomasks used for each patterned layer, resulting in significantly increased manufacturing cost. On the other hand, the method of altering the manufacturing process need not require redesign of the photomasks, and the manufacturing cost isn't necessarily increased significantly. However, the effect of solving the discharge problem after altering the manufacturing process is not clear. Furthermore, the discharge problem is even worse for display panels with large dimensions or high pixel density, which have become prevalent among TFT-LCD display panels, and for which the two methods mentioned above do not work.

In view of the above, the problem of abnormal discharge occurring in the manufacturing process of display panels has not been effectively solved in the prior art.

SUMMARY

The present disclosure provides an apparatus and a display panel preparation system based thereon, which can mitigate or avoid the problems mentioned above. For example, the present disclosure provides an apparatus and a display panel preparation system based thereon, which can effectively mitigate or avoid the problem of abnormal discharge occurring in the manufacturing process of display panels.

According to one exemplary aspect of the present disclosure, a discharge apparatus comprises a contact terminal and a voltage controller, wherein the contact terminal may be a conductor configured to electrically connect with an electrostatic discharge contactor on a substrate to be processed, and wherein the voltage controller may be electrically connected to the contact terminal so as to adjust the voltage on the contact terminal, in order to eliminate the static electricity on the substrate to be processed.

The discharge apparatus may be used in the manufacturing process of display panels, which can release the charges within the substrate, and eliminate the electrostatic charges produced on the surface of the substrate to be processed by way of neutralization, leading to mitigation or prevention of the occurrence of abnormal discharge during the manufacturing process of display panels.

Furthermore, the contact terminal may also be configured to shield the electrostatic discharge contactor. In this way, the contact terminal can prevent the electrostatic discharge contactor from being covered by an insulating layer, which could lead to the connection between the contact terminal and the electrostatic discharge contactor will be destroyed or otherwise rendered ineffective, such that the static electricity could not be effectively eliminated.

Furthermore, the contact terminal may be plate-shaped to more effectively shield the electrostatic discharge contactor.

According to another exemplary aspect of the present disclosure, a display panel preparation system comprises the discharge apparatus described above and a substrate to be processed on which a static electricity releasing line and an electrostatic discharge contactor can be disposed, wherein at least one display panel including metal lines therein may be disposed on the substrate to be processed, and the static electricity releasing line may be electrically connected to the metal lines and the electrostatic discharge contactor.

Furthermore, the static electricity releasing line can be disposed in cutting regions outside the display panel on the substrate to be processed, and the metal lines can extend to the cutting regions to connect with the static electricity releasing line.

Furthermore, the electrostatic discharge contactor may be positioned in the area outside the display panel on the substrate to be processed, to realize the connection between the electrostatic discharge contactor and the static electricity releasing line.

Furthermore, the electrostatic discharge contactor may be disposed at the edge of the substrate to be processed, so as to facilitate the contact between the electrostatic discharge contactor and the contact terminal in the discharge apparatus.

In one exemplary embodiment, the width of the electrostatic discharge contactor may be larger than the width of the static electricity releasing line, which facilitates a more reliable connection between the static electricity releasing line and the electrostatic discharge contactor.

Furthermore, the voltage controller may provide a predetermined voltage to eliminate the static electricity.

Furthermore, the contact terminal may be configured or otherwise constructed (e.g., sized, shaped) to shield the electrostatic discharge contactor during the manufacturing process of the display panel, which prevents insulating materials from covering the electrostatic discharge contactor.

Furthermore, the static electricity releasing line may comprise at least one layer, with each layer of the static electricity releasing line corresponding to one metal lines layer within the display panels.

Furthermore, the electrostatic discharge contactors connected to different layers of the static electricity releasing lines may be either mutually independent or connected to each other.

In another exemplary embodiment, a plurality of display panels may be situated on the substrate to be processed, wherein the multiple display panels on the substrate to be processed may be distributed in rows and/or columns on the substrate to be processed, and the corresponding static electricity releasing lines electrically connected to the metal lines within the multiple display panels may be distributed in rows and/or columns, so as to facilitate the subsequent cutting process of the multiple display panels.

In yet another exemplary embodiment, each layer of the static electricity releasing line may include multiple static electricity releasing lines.

Furthermore, the multiple static electricity releasing lines in each layer may be cross distributed in one or more rows and one or more columns. In this manner, more effective prevention of the abnormal discharge phenomenon could be achieved.

The embodiments according to the present disclosure include a discharge apparatus and a display panel preparation system based thereon. The discharge apparatus may comprise a contact terminal, being a conductor, configured to electrically connect with an electrostatic discharge contactor on a substrate to be processed; and a voltage controller electrically connected to the contact terminal, which is configured to adjust the voltage on the contact terminal, so as to eliminate the static electricity on the substrate to be processed.

The discharge apparatus and display panel preparation system described herein can be applied to the manufacturing process of display panels with large dimensions and/or high pixel density. Under the function of output voltage of the voltage controller, the static electricity releasing line can produce charges balancing with the electrostatic charges to eliminate the large amount of charges accumulated on the surface of the display panels. When the voltage controller is connected to the electrostatic discharge contactor through the contact terminal, the voltage controller is utilized to adjust the voltage on the contact terminal to eliminate the charges on the surface of the display panels, avoiding the occurrence of abnormal discharge, and leading to effective control of abnormal discharge of charges accumulated on the surface of the display panels, such that the balance between the charges on the surface of the display panels and the plasma electric field within the process reaction chamber is substantially maintained.

The meanings of the reference numbers in the figures are: 10 mesa; 20 substrate to be processed; 30 display panel; 40 metal lines; 50 static electricity releasing line; 60 electrostatic discharge contactor; 70 contact terminal; and 80 voltage controller.

DETAILED DESCRIPTION

The present invention and associated general inventive concepts will be further described hereinafter in detail with reference to the accompanying drawings and various exemplary embodiments. One of ordinary skill in the art will appreciate that these exemplary embodiments only constitute some of the possible embodiments encompassed by the present invention and associated general inventive concepts. As such, the scope of the present disclosure is by no means limited to the exemplary embodiments set forth herein.

In the manufacturing process of display panels (e.g., TFT-LCD display panels), formation of associated metal lines may result in charges accumulating on the surface of the display panels or alternately varying along with voltage on the display panels. These charges may influence the charges produced by plasma within the process reaction chamber, imparting turbulence to a plasma electric field within the reaction chamber, and eventually leading to occurrence of abnormal discharge. The charges accumulated on the surface of the display panels are the main factor causing the abnormal discharge phenomenon, such that it would be beneficial to eliminate the charges accumulated on the surface of the display panels in a timely manner.

Figure 1:
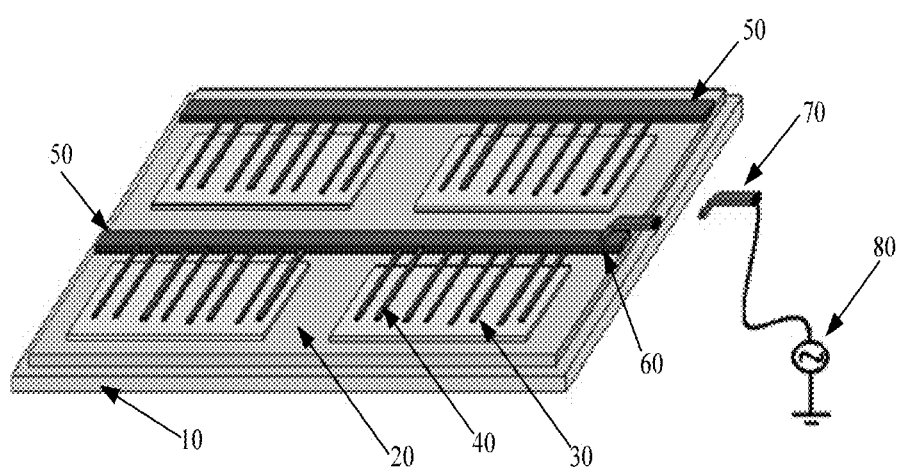
FIG. 1 is a perspective view of a structural diagram that illustrates a discharge apparatus and a display panel preparation system including the discharge apparatus, according to an exemplary embodiment.

FIG. 1 schematically shows a structural diagram of a discharge apparatus and a display panel preparation system including the discharge apparatus, according to an exemplary embodiment. The discharge apparatus comprises a contact terminal 70 and a voltage controller 80. The contact terminal 70 is a conductor configured or otherwise operable to electrically connect with an electrostatic discharge contactor 60 on a substrate 20 to be processed. The voltage controller 80 is connected to the contact terminal 70 to adjust the voltage on the contact terminal 70, thereby eliminating the static electricity on the substrate 20 to be processed. In one exemplary embodiment, the electrostatic discharge contactor 60 is formed by manufacturing patterns on the substrate 20 to be processed by means of film-formation, photolithography, and an etching process.

The discharge apparatus may be used in the manufacturing process of display panels to avoid the occurrence of abnormal discharge of the display panels. The display panels may include, for example, array substrates or color film substrates. Taking array substrates for instance, metal films are formed on a substrate (e.g., a glass substrate) to create metal lines (e.g., gate lines) through patterning processes, during which these metal lines may result in charges on the surface of the substrate to be processed. Since the contact terminal 70 is a conductor, by connecting the contact terminal 70 in the discharge apparatus to the electrostatic discharge contactor 60 on the substrate 20 to be processed, and by controlling the voltage controller 80 to output appropriate voltage in accordance with parameters reflecting the static electricity carried on the substrate such as self-bias voltage, actual voltage of the substrate, and so on, the voltage on the contact terminal 70 can be adjusted to release and neutralize the surface charges on the substrate 20 to be processed, so as to eliminate the charges on the surface of the substrate 20 to be processed, mitigate or avoid the buildup of static electricity, and/or prevent the abnormal discharge from occurring on the surface of the substrate during the manufacturing process of display panels.

Furthermore, in one exemplary embodiment, the contact terminal 70 is configured or otherwise operable to shield the electrostatic discharge contactor 60. For example, when the contact terminal 70 is connected to the electrostatic discharge contactor 60, it enables the release and neutralization of surface charges on the substrate 20 to be processed; meanwhile, the electrostatic discharge contactor 60 can be shielded by the contact terminal 70 during the process of forming an insulating layer to prevent the electrostatic discharge contactor 60 from becoming incapable of connecting to the contact terminal 70 by being covered with the insulating layer and thus losing the function of releasing the static electricity. In an exemplary embodiment, the shape of the contact terminal 70 is plate-shaped, and the plate-shaped contact terminal 70 can effectively shield the electrostatic discharge contactor 60.

In summary, the discharge apparatus provided by the present disclosure may be used in the preparation process of display panels, during which the charges within the substrate can be released and the electrostatic charges produced on the surface of the substrate are eliminated by the way of neutralization, that is to say, the electrostatic charges are eliminated by way of being canceled out by charges balancing with the display panel surface charges and produced by the voltage controller, leading to mitigation or avoidance of abnormal discharge during the manufacturing process of display panels.

FIG. 1 also shows a display panel preparation system including the discharge apparatus described above, according to an exemplary embodiment. As seen in FIG. 1, in addition to the discharge apparatus, the display panel preparation system also includes a substrate 20 to be processed with a static electricity releasing line 50 and an electrostatic discharge contactor 60 disposed thereon. At least one display panel 30 including metal lines 40 therein may be disposed on the substrate 20 to be processed. The static electricity releasing line 50 is electrically connected to the metal lines 40 and the electrostatic discharge contactor 60. In an exemplary embodiment, the static electricity releasing line 50 is formed by manufacturing patterns on the substrate 20 to be processed by means of film-formation, photolithography, and an etching process.

In order to maximize the utilization of the glass substrate and improve the utilization efficiency of the glass substrate, the patterning processes for the same layer of different display panels 30 can be identical, such that multiple display panels 30 can be simultaneously manufactured on a relatively larger substrate 20 to be processed. For example, FIG. 1 shows a case in which four display panels 30 are being simultaneously manufactured. A single display panel 30 with desired dimensions can be obtained by cutting the substrate 20, after the manufacturing of the multiple display panels 30 is completed.

By way of example, if the display panels 30 to be manufactured are array substrates, the manufacturing process may include steps of depositing metal films on a substrate, forming metal lines 40 through a first patterning process, then forming an insulating layer, sequentially forming metal films, forming metal lines 40 again through a second patterning process, and repeating in this way until all films have been formed completely. Therefore, there may be at least two layers of metal lines 40 in the resulting array substrates.

In the case of simultaneously forming multiple display panels 30, outside of the display panels 30 on the substrate 20 to be processed, there may be cutting regions between adjacent display panels 30, which are regions not belonging to the display panels 30. As seen in FIG. 1, the static electricity releasing line 50 can be arranged in the cutting regions outside the display panels 30, and the metal lines 40 may extend to the cutting regions to connect with the static electricity releasing line 50. That is to say, the static electricity releasing line 50 and the metal lines 40 can be formed in the same layer on the substrate 20 to be processed, although they are located in different areas. The metal lines 40 may be formed within the display panels 30, and the static electricity releasing line 50 may be formed in the cutting regions outside of the display panels 30. The metal lines 40 may extend towards the cutting regions and make electrical connection with the static electricity releasing line 50.

In an exemplary embodiment, the electrostatic discharge contactor 60 is positioned in the area outside of the display panels 30, i.e., in the cutting regions, to achieve the connection with the static electricity releasing line 50. Moreover, the electrostatic discharge contactor 60 may be positioned at the edge of the substrate 20 to be processed to facilitate the connection with the contact terminal 70.

The voltage controller 80 in the display panel preparation system provides a predetermined voltage to eliminate the static electricity. When the contact terminal 70 in the discharge apparatus is connected to the electrostatic discharge contactor 60, the voltage controller 80 provides the predetermined voltage to the electrostatic discharge contactor 60, wherein the amount of charges produced by the predetermined voltage is identical to the amount of electrostatic charges produced by the metal lines 40 within display panels 30, while the polarity of the electrostatic charges produced by the predetermined voltage is opposite to the polarity of the electrostatic charges produced by the metal lines 40 within display panel 30. Consequently, the electrostatic charges produced by the metal lines 40 within the display panel 30 can be eliminated through neutralization by means of the voltage controller 80, thereby preventing or otherwise mitigating the abnormal discharge phenomenon.

In an exemplary embodiment, the voltage controller 80 is a voltage source in which the output voltage can be adjusted on demand, wherein the specific magnitude of the applied voltage can be set depending on the specific situation.

In an exemplary embodiment, the contact terminal 70 also has a function of shielding, besides the function of electrical connection between the voltage controller 80 and the electrostatic discharge contactor 60. In particular, the contact terminal 70 is configured or otherwise operable to shield the electrostatic discharge contactor 60 during the manufacturing process of display panels 30, thereby preventing an insulating layer from covering the electrostatic discharge contactor 60. In this manner, the electrostatic discharge contactor 60 can achieve the proper connection (specifically, the electrical connection) between the static electricity releasing line 50 and the contact terminal 70. Thus, in order to prevent the electrostatic discharge contactor 60 from being covered by the insulating layer, the contact terminal 70 shields the electrostatic discharge contactor 60 during the manufacturing process.

In an exemplary embodiment, the static electricity releasing line 50 includes at least one layer, with each layer of static electricity releasing line 50 corresponding to one layer of metal lines 40 in the display panels 30, namely the static electricity releasing line 50 and the metal lines 40 in the display panels 30 may be arranged correspondingly. Here the term "correspondingly" refers to the distribution of layer structure, namely one layer of metal lines 40 corresponds to one layer of static electricity releasing line 50. Each layer of static electricity releasing line 50 may be connected to the metal lines 40 of the same layer in the display panels 30, to achieve the elimination of static electricity produced by the layer of metal lines 40 on the surface of the substrate 20 to be processed.

Furthermore, the electrostatic discharge contactors 60 connected to the static electricity releasing lines 50 of different layers may be either mutually independent or connected to each other. Namely, for the static electricity releasing line 50 of different layers, they can share a common electrostatic discharge contactor 60, or each layer of the static electricity releasing line 50 can be connected to the electrostatic discharge contactor 60 of that same layer. For example, whether the electrostatic discharge contactor can be shared by the static electricity releasing lines of two layers or not may be determined by considering the actual pattern on each layer of the display panel 30. If there is an active pattern at a position of the present layer corresponding to the position of the electrostatic discharge contactor of the above layer, then the electrostatic discharge contactor may not be shared by the static electricity releasing lines of the present layer and the above layer.

A structural diagram of the display panel 30 preparation system, operating according to an exemplary embodiment, is also shown in FIG. 1. The substrate 20 to be processed may be arranged on a mesa 10, wherein the display panel 30 formed on the substrate 20 to be processed, for example, can be an array substrate. FIG. 1 shows a case in which four array substrates are formed on the substrate 20 to be processed. However, in practice, more or fewer array substrates could be processed at the same time.

The four array substrates in FIG. 1 are distributed in a 2*2 matrix, wherein all the metal lines 40 of the two array substrates in the first row are connected to a static electricity releasing line 50 in the cutting region outside of the array substrates, and all the metal lines 40 of the two array substrates in the second row are connected to another static electricity releasing line 50 in the cutting region outside of the array substrates.

It should be noted that the static electricity releasing lines 50 in FIG. 1 may be distributed in rows, but also can be distributed in columns. For example, all the metal lines 40 within the two display panels 30 in the first column could be connected to a first static electricity releasing line (not shown) arranged in a column. Similarly, all the metal lines 40 within the two display panels 30 in the second column could be connected to a second static electricity releasing line (not shown) arranged in a column. Although the two static electricity releasing lines 50 shown in FIG. 1 are independent of each other, they could also be electrically connected with one another. In other exemplary embodiments, a corresponding static electricity releasing line can be arranged for each display panel 30 for finer electrostatic adjustment of each display panel 30.

Furthermore, in general, the multiple display panels 30 (e.g., the array substrates) on the mesa 10 for the substrate 20 to be processed may be distributed in a matrix, namely distributed in rows and/or columns. The multiple display panels 30 may be distributed in one row, distributed in one column, or distributed in a matrix of m*n rows and columns. Still further, the respective static electricity releasing lines 50 on the substrate 20 to be processed may also be distributed in rows and/or columns. For instance, all the metal lines 40 within the display panels 30 of the same row may be connected to one of the static electricity releasing lines 50 arranged in rows; or all the metal lines 40 within the display panels 30 of the same column can be connected to one of the static electricity releasing lines 50 arranged in columns.

The distribution manner of the display panels 30 and the layout manner of the static electricity releasing lines 50 described herein are merely illustrative, and the general inventive concepts are not intended to be limited to these exemplary distributions. In particular, the display panels 30 can also be distributed in manners other than those described herein. For example, the display panels 30 could be distributed in accordance with the following irregular manners: (1) The display panels 30 of different rows or different columns are in interlaced distribution, for example, wherein the midline of the display panels 30 in the second row/column may correspond to the gap between the display panels 30 in the first row/column, but not be consistent with the midline of the display panels 30 in the first row/column. The static electricity releasing lines 50 can still be distributed in rows and/or columns. (2) If the number of display panels 30 is large enough, there may be three display panels 30 distributed at the three vertices of a triangle in the center of the mesa 10, and the triangles formed by the rest of the display panels 30 may be concentric with the central triangle. The distributing path and number of the static electricity releasing lines 50 can be arbitrary, as long as the metal lines 40 within all the display panels 30 on the substrate 20 to be processed can be electrically connected to each other through the static electricity releasing lines 50. (3) To further expand the distribution manner of (2), the geometric figures formed by the multiple display panels 30 may also be in the shape of a pentagon, a hexagon, and so on, and can even be in an irregular distribution. Again, the distributing path and number of the static electricity releasing lines 50 can be arbitrary, as long as the metal lines 40 within all the display panels 30 on the substrate 20 to be processed can be electrically connected to each other through the static electricity releasing lines 50.

FIG. 1 only shows one exemplary case, and does not indicate or otherwise define all the possible arrangements of the static electricity releasing lines 50. In other exemplary embodiments, the distribution manner of the display panels 30 (e.g., the array substrates) and the static electricity releasing lines 50 may also be designed in any other suitable manner. In one exemplary embodiment, to facilitate the subsequent cutting process, multiple display panels 30 (e.g., array substrate) can be distributed in rows and/or columns on the substrate 20 to be processed, and the corresponding static electricity releasing line 50 electrically connected to the metal lines 40 within the display panels 30 may also be distributed in rows and/or columns.

Figure 2:
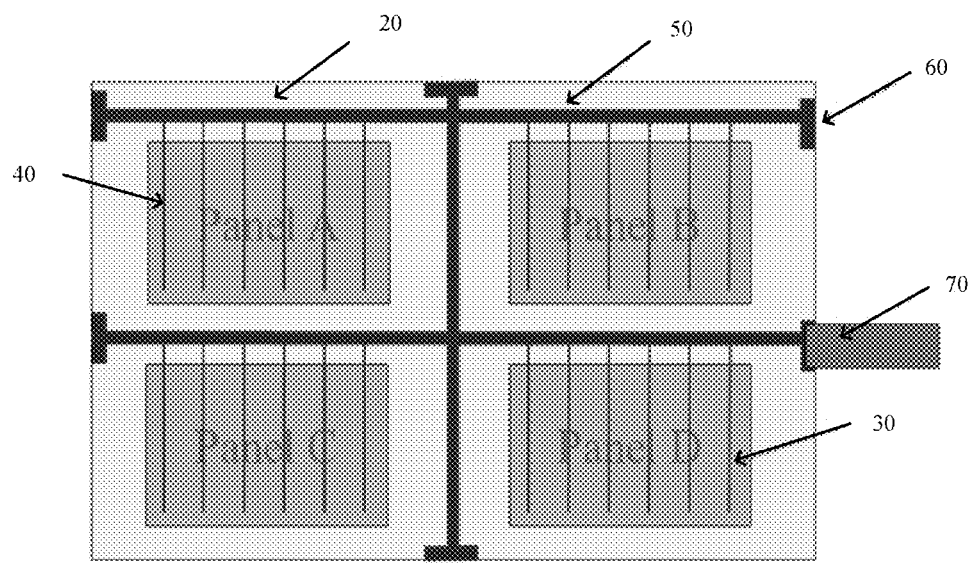
FIG. 2 is a top view of a diagram that illustrates the display panel preparation system, according to an exemplary embodiment.

For example, the static electricity releasing lines 50 can also be distributed in intersecting rows and columns in order to prevent abnormal discharge more effectively. FIG. 2 schematically illustrates a top view of the display panel 30 preparation system, according to an exemplary embodiment, wherein there are four display panels 30 formed on the substrate 20 to be processed, namely Panel A, Panel B, Panel C, and Panel D. Each layer of the static electricity releasing lines 50 may include multiple static electricity releasing lines (e.g., three static electricity releasing lines), and the multiple static electricity releasing lines 50 can be distributed in intersecting rows and columns. As shown in FIG. 2, there are some static electricity releasing lines 50 distributed in rows and others distributed in columns, wherein the static electricity releasing lines 50 are electrically connected with each other at the intersecting points. Due to the static electricity releasing lines 50 being cross-distributed in rows and columns, more effective prevention of abnormal discharge can be realized.

In one exemplary embodiment, to ensure more reliable connection between the static electricity releasing line 50 and the electrostatic discharge contactor 60, the width of the electrostatic discharge contactor 60 is larger than the width of the static electricity releasing line 50, as shown in FIG. 2.

Figure 3:
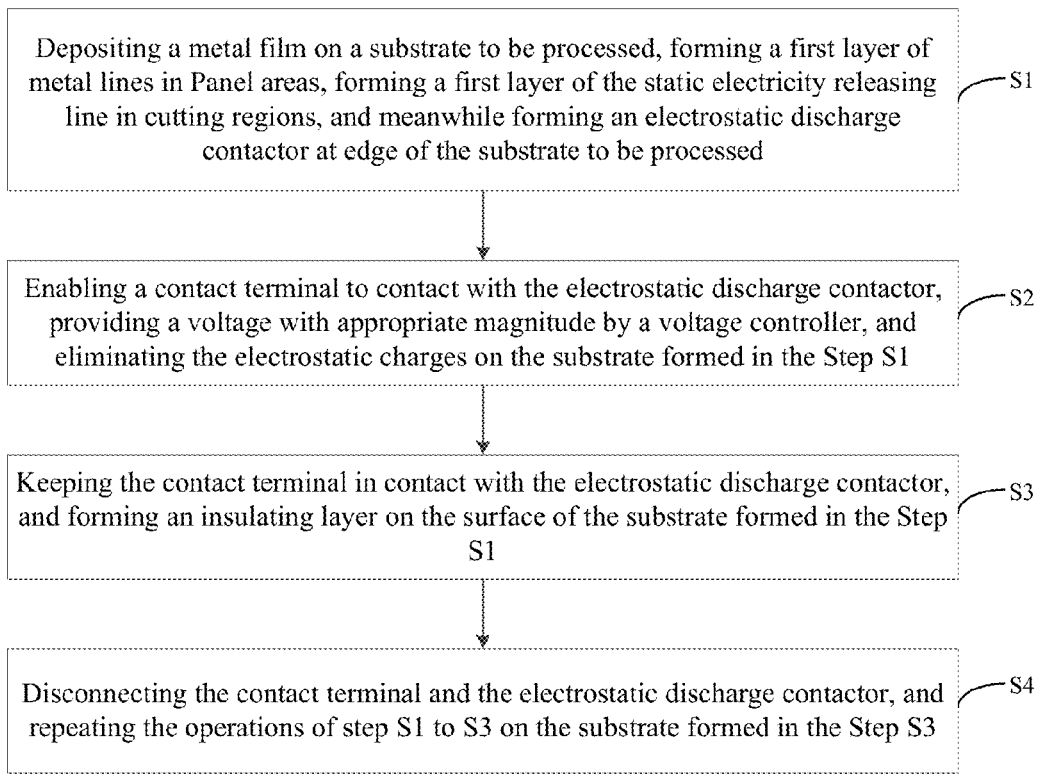
FIG. 3 is a flow chart showing the steps of processing array substrates using the display panel preparation system, according to an exemplary embodiment.

A flow chart of a method of forming an array substrate using the display panel 30 preparation system described above is shown in FIG. 3. The method may include the following steps.

Before the manufacturing process is started, region division is performed on the substrate 20 to be processed. For example, the substrate 20 to be processed is divided into two region types, wherein one is the area for forming the display panels 30 after the completion of the manufacturing process, i.e., the areas where the Panel A, Panel B, Panel C, and Panel D are positioned, and the other is the area outside of these four panel areas, i.e., the cutting region. This step can be designed and performed according to the specific design requirements and the model types of the devices.

In step S1, the sub-steps of depositing a metal film on the substrate 20 to be processed, forming a first layer of the metal lines 40 in the panel areas by a first patterning process, forming a first layer of the static electricity releasing lines 50 in the cutting region, and, at the edge of the substrate 20 to be processed, forming the electrostatic discharge contactor 60 at the position connecting to the first layer of the static electricity releasing line 50s, are performed. To achieve more effective prevention of static electricity, the electrostatic discharge contactor 60 can be arranged at any position where the static electricity releasing line 50 is adjacent to the edge of substrate 20 to be processed; but arranging the electrostatic discharge contactor 60 at just one of the positions where the static electricity releasing line 50 is adjacent to the edge of substrate 20 to be processed can also work well for preventing static electricity, as shown in FIG. 1.

In step S2, the sub-steps of enabling the contact terminal 70 in the discharge apparatus to contact the electrostatic discharge contactor 60, providing an appropriate voltage through the voltage controller 80, and eliminating the electrostatic charges generated between the metal lines 40 of the first layer formed in step S1 on the substrate are performed.

In step S3, the sub-steps of keeping the contact terminal 70 in contact with the electrostatic discharge contactor 60 and forming an insulating layer on the surface of the substrate formed in step S1 are preformed. Due to the shield provided by the contact terminal 70, no significant insulating layer will be formed above or on the electrostatic discharge contactor 60.

In step S4, the sub-steps of disconnecting the contact terminal 70 and the electrostatic discharge contactor 60 and repeating the steps S1 to S3 on the substrate formed in step S3 to form a second layer of the metal lines 40, a second layer of the static electricity releasing lines 50, and the corresponding electrostatic discharge contactor 60 are performed.

During the manufacturing process of display panels 30, the contact terminal 70 can be connected to the electrostatic discharge contactor 60 on the display panels 30. In the early stage of the abnormal discharge phenomenon, there may already be some charges accumulated on the surface of the display panels 30, which may lead to the occurrence of the abnormal discharge. At this moment, since the voltage controller 80 can be electrically connected to the metal lines 40 within the display panels 30 through the contact terminal 70, the electrostatic discharge contactor 60, and the static electricity releasing line 50, sequentially, the surface charges of the display panels 30 can be conducted to the voltage controller 80 and then detected. In this manner, utilizing the voltage adjustment function of the voltage controller 80, the surface charges of the display panels 30 can be eliminated or significantly reduced by neutralization, i.e., by producing charges balancing with the static electricity, so as to keep the balance between the surface charges on the display panels 30 and the plasma electric field within the reaction chamber, and eventually eliminate the abnormal discharge on the display panels 30.

In view of the above, in the display panel preparation system, all the metal lines within the display panels can be electrically connected by arranging the static electricity releasing lines, electrostatic discharge contactors can be arranged at the edge of the substrate to be processed, all the static electricity releasing lines can be electrically connected to the corresponding electrostatic discharge contactors, and the conductive contact terminal can be connected to the voltage controller. Utilizing the voltage adjustment function of the voltage controller, the surface charges of the display panels can be eliminated by neutralization, i.e., the large amount of charges accumulated on the surface of the display panels can be eliminated or otherwise significantly reduced by producing charges balancing with the alternating charges on the display panels, to avoid the occurrence of abnormal discharge, and eventually to achieve the balance between the surface charges on the display panels and the plasma electric field within the reaction chamber. The display panel preparation system is applicable to the manufacturing of current display panels, including those having large dimensions and/or high pixel density.

Although the present disclosure has been described with reference to specific embodiments, it should be understood that the limitations of the described embodiments are provided merely for purpose of illustration and are not intended to limit the present invention and associated general inventive concepts. Instead, the scope of the present invention is defined by the appended claims, and all variations and equivalents that fall within the range of the claims are intended to be embraced therein. Thus, other embodiments than the specific exemplary ones described herein are equally possible within the scope of these appended claims. Additionally, it is to be noted that in the claims, the terms "comprising" and "including" do not exclude other elements or steps, and the indefinite articles "a" and "an" do not exclude a plurality.

The invention claimed is:

1. An apparatus comprising a contact terminal and a voltage controller,
    wherein the contact terminal is a conductor operable to directly connect with an electrostatic discharge contactor on a substrate to be processed, with the contact terminal being independent of any portion of the substrate to be processed, and
    wherein the voltage controller is electrically connected to the contact terminal and operable to adjust a voltage on the contact terminal,
    whereby static electricity on the substrate to be processed is neutralized,
    wherein the voltage controller is a voltage source outside of the substrate to be processed whose output voltage is capable of being adjusted.

2. The apparatus of claim 1, wherein the contact terminal is operable to shield the electrostatic discharge contactor.

3. The apparatus of claim 1, wherein the contact terminal is plate-shaped.

4. A display panel preparation system comprising:
    a substrate to be processed with a static electricity releasing line and an electrostatic discharge contactor disposed thereon;
    a conductive contact terminal operable to directly connect with the electrostatic discharge contactor on the substrate to be processed, with the conductive contact terminal being independent of any portion of the substrate to be processed; and
    a voltage controller electrically connected to the contact terminal, the voltage controller operable to adjust a voltage on the contact terminal, to neutralize the static electricity on the substrate to be processed,
    wherein at least one display panel including metal lines therein is disposed on the substrate to be processed, and
    wherein the static electricity releasing line is electrically connected to the metal lines and the electrostatic discharge contactor, wherein the voltage controller is a voltage source outside of the substrate to be processed whose output voltage is capable of being adjusted.

5. The display panel preparation system of claim 4, wherein the static electricity releasing line is disposed in a cutting region outside the display panel on the substrate to be processed, and
wherein the metal lines extend to the cutting region to connect with the static electricity releasing line.

6. The display panel preparation system of claim 5, wherein the electrostatic discharge contactor is positioned in the cutting region.

7. The display panel preparation system of claim 6, wherein the electrostatic discharge contactor is disposed at an edge of the substrate to be processed.

8. The display panel preparation system of claim 4, wherein a width of the electrostatic discharge contactor is larger than a width of the static electricity releasing line.

9. The display panel preparation system of claim 4, wherein the voltage controller provides a predetermined voltage to neutralize the static electricity.

10. The display panel preparation system of claim 4, wherein the contact terminal is at least one of shaped and sized to shield the electrostatic discharge contactor during a manufacturing process of the display panel,
whereby the contact terminal prevents insulating material from covering the electrostatic discharge contactor.

11. The display panel preparation system of claim 4, wherein the static electricity releasing line comprises at least one layer, and
wherein each layer of the static electricity releasing line corresponds to one layer of metal lines within the display panel.

12. The display panel preparation system of claim 11, wherein a plurality of electrostatic discharge contactors are provided and connected to static electricity releasing lines of different layers, and
wherein the electrostatic discharge contactors are one of mutually independent or connected to each other.

13. The display panel preparation system of claim 12, wherein a plurality of display panels are distributed in at least one of rows and columns on the substrate to be processed, and
wherein the corresponding static electricity releasing lines electrically connected to the metal lines within the display panels are distributed in at least one of rows and columns.

14. The display panels preparation system of claim 12, wherein each layer of the static electricity releasing line includes a plurality of static electricity releasing lines.

15. The display panel preparation system of claim 14, wherein the static electricity releasing lines are cross-distributed in one or more rows and one or more columns.

\* \* \* \* \*